United States Patent
Lee et al.

(10) Patent No.: US 11,424,280 B2
(45) Date of Patent: Aug. 23, 2022

(54) SOLID-STATE IMAGE SENSOR WITH PILLAR SURFACE MICROSTRUCTURE AND METHOD OF FABRICATING THE SAME

(71) Applicant: Powerchip Semiconductor Manufacturing Corporation, Hsinchu (TW)

(72) Inventors: Shih-Ping Lee, Hsinchu (TW); Yi-Ping Lin, Hsinchu County (TW); Yu-Ching Liao, Hsinchu County (TW); Ya-Ting Chen, Hsinchu County (TW); Hsin-Ying Tung, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 182 days.

(21) Appl. No.: 16/845,046

(22) Filed: Apr. 9, 2020

(65) Prior Publication Data

US 2021/0288094 A1 Sep. 16, 2021

(30) Foreign Application Priority Data

Mar. 10, 2020 (TW) .................................. 109107863

(51) Int. Cl.
*H01L 27/146* (2006.01)

(52) U.S. Cl.
CPC .... *H01L 27/14625* (2013.01); *H01L 27/1462* (2013.01); *H01L 27/1464* (2013.01); *H01L 27/14627* (2013.01); *H01L 27/14643* (2013.01); *H01L 27/14685* (2013.01)

(58) Field of Classification Search
CPC ........... H01L 27/14625; H01L 27/1462; H01L 27/14627; H01L 27/1464; H01L 27/14643; H01L 27/14685; H01L 27/14601; H01L 27/14632; H01L 27/14687

See application file for complete search history.

(56) References Cited

U.S. PATENT DOCUMENTS

| | | | |
|---|---|---|---|
| 2010/0244169 A1* | 9/2010 | Maeda | H01L 21/31144 257/E31.127 |
| 2020/0027915 A1* | 1/2020 | Hsieh | H01L 31/02366 |
| 2020/0279881 A1* | 9/2020 | Jin | H01L 27/14603 |
| 2021/0116713 A1* | 4/2021 | Chen | G02B 27/30 |
| 2021/0134867 A1* | 5/2021 | Jin | H01L 27/14627 |
| 2021/0210537 A1* | 7/2021 | Hsieh | H01L 31/02327 |

\* cited by examiner

*Primary Examiner* — Jonathan Han
(74) *Attorney, Agent, or Firm* — Winston Hsu

(57) ABSTRACT

A solid-state image sensor with pixels each including a photoelectric conversion portion made of a second type doped semiconductor layer and a semiconductor material layer, and the second type doped semiconductor layer contacts a first type doped semiconductor substrate. An anti-reflective portion is provided with multiple micro pillars on the semiconductor material layer, wherein micro pillars are isolated by recesses extending into the photoelectric conversion portion, and the refractive index of the micro pillar gradually decreases from bottom to top and is smaller than the refractive index of the light-receiving portion of the semiconductor material layer.

8 Claims, 8 Drawing Sheets

SOLID-STATE IMAGE SENSOR WITH PILLAR SURFACE MICROSTRUCTURE AND METHOD OF FABRICATING THE SAME

BACKGROUND OF THE INVENTION

1. Field of the Invention

The present invention relates generally to a solid-state image sensor, and more specifically, to a solid-state image sensor with pillar surface microstructure and method of fabricating the same capable of improving quantum efficiency and suppressing dark current.

2. Description of the Prior Art

Electronic equipment using semiconductor devices are essential for many modern applications. Solid-state (e.g. semiconductor) image sensors are commonly involved in electronic equipment used for sensing light, wherein complementary metal-oxide-semiconductor (CMOS) image sensors are widely used in various applications, such as digital camera and mobile phone cameras. The CMOS image sensor typically includes an array of picture elements (pixels). Each pixel includes a transistor, a capacitor and a photo-diode, wherein electrical energy is induced in the photo-diode upon exposure to the light. Each pixel generates electrons proportional to an amount of light falling on the pixel. The electrons are converted into a voltage signal in the pixel and further transformed into digital signal.

The CMOS image sensors are classified as front side illuminated (FSI) image sensors and back side illuminated (BSI) image sensors, depending on the light path difference. The BSI image sensors are gaining in popularity, for its light is incident on a back side of a substrate of the BSI image sensor and hits the photo-diode directly without obstruction from dielectric layers and interconnect layers formed on the substrate. Such a direct incidence makes the BSI image sensor more sensitive to the light.

Additionally, in some solid-state imaging devices, a so-called moth-eye structure, in which a fine uneven structure is provided on a boundary surface on a light-receiving surface side of a silicon layer in which a photodiode is formed, has been proposed as a structure for preventing reflection of incident light.

Although the moth-eye structure can improve sensitivity by preventing reflection of incident light, as technologies evolve, the image sensor device is becoming increasingly smaller in size while having greater functionality and greater amounts of integrated circuitry. The BSI image sensor has been shrunk to a smaller pixel pitch and thus may lead to undesirable performance of the BSI image sensor. Therefore, there is a continuous need to improve a structure and a manufacturing method for of the BSI image sensor device in order to improve the performance of the BSI image sensor device (e.g. increase quantum efficiency) as well as suppress dark current and noise.

SUMMARY OF THE INVENTION

In order to further improve the performance of solid-state image sensor, the present invention hereby provides a novel solid-state image sensor structure featuring the moth-eye structure formed by multiple micro pillars protruding from the light-receiving surface. In addition, the micro pillar is provided with a refractive index gradually decreases from bottom to top, and the bottom of recesses between the micro pillars is formed into a particular shape, which may further reduce the reflection of incident light.

One aspect of present invention is to provide a solid-state image sensor, consisting of a first type doped semiconductor substrate, multiple pixels on the first type doped semiconductor substrate, wherein each pixel includes a photoelectric conversion portion made of a second type doped semiconductor layer and a semiconductor material layer, and the second type doped semiconductor layer contacts the first type doped semiconductor substrate, and an anti-reflective portion with multiple micro pillars on the semiconductor material layer, wherein the micro pillars are isolated by recesses extending into the photoelectric conversion portion, and a refractive index of the micro pillar gradually decreases from bottom to top and is smaller than a refractive index of the semiconductor material layer, and a microlens on the anti-reflective portion and multiple inter-pixel blocking portions between the pixels.

Another aspect of present invention is to provide a solid-state image sensor, consisting of a first type doped semiconductor substrate, multiple pixels on the first type doped semiconductor substrate, wherein each pixel includes a photoelectric conversion portion made of a second type doped semiconductor layer and a semiconductor material layer, and the second type doped semiconductor layer contacts the first type doped semiconductor substrate, and the semiconductor material layer is provided with multiple micro pillars isolated by recesses, and each recess is provided with a diamond-shaped bottom with {111} crystallographic planes, and a microlens on the semiconductor material layer and multiple inter-pixel blocking portions between the pixels.

Still another aspect of present invention is to provide a method of fabricating a solid-state image sensor, comprising providing a first type doped semiconductor substrate; forming a second type doped semiconductor layer and a semiconductor material layer sequentially on said first type doped semiconductor substrate to constitute a photoelectric conversion portion; forming a multilayer structure on said semiconductor material layer, wherein a refractive index of said multilayer structure gradually decreases from a bottom layer to a top layer of said multilayer structure and is smaller than a refractive index of said semiconductor material layer; and performing a photolithography process to said multiplayer structure and said photoelectric conversion portion to form multiple micro pillars, wherein said micro pillars protrude from said semiconductor material layer and are isolated by recesses extending into said photoelectric conversion portion.

Still another aspect of present invention is to provide a method of fabricating a solid-state image sensor, consisting of providing a first type doped semiconductor substrate, forming a second type doped semiconductor layer and a semiconductor material layer sequentially on the first type doped semiconductor substrate to constitute a photoelectric conversion portion, performing a photolithography process to the photoelectric conversion portion to form multiple micro pillars, wherein the micro pillars are isolated by recesses, and performing a wet etching process to form a diamond-shaped bottom with {111} crystallographic planes for each recess on the photoelectric conversion portion.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
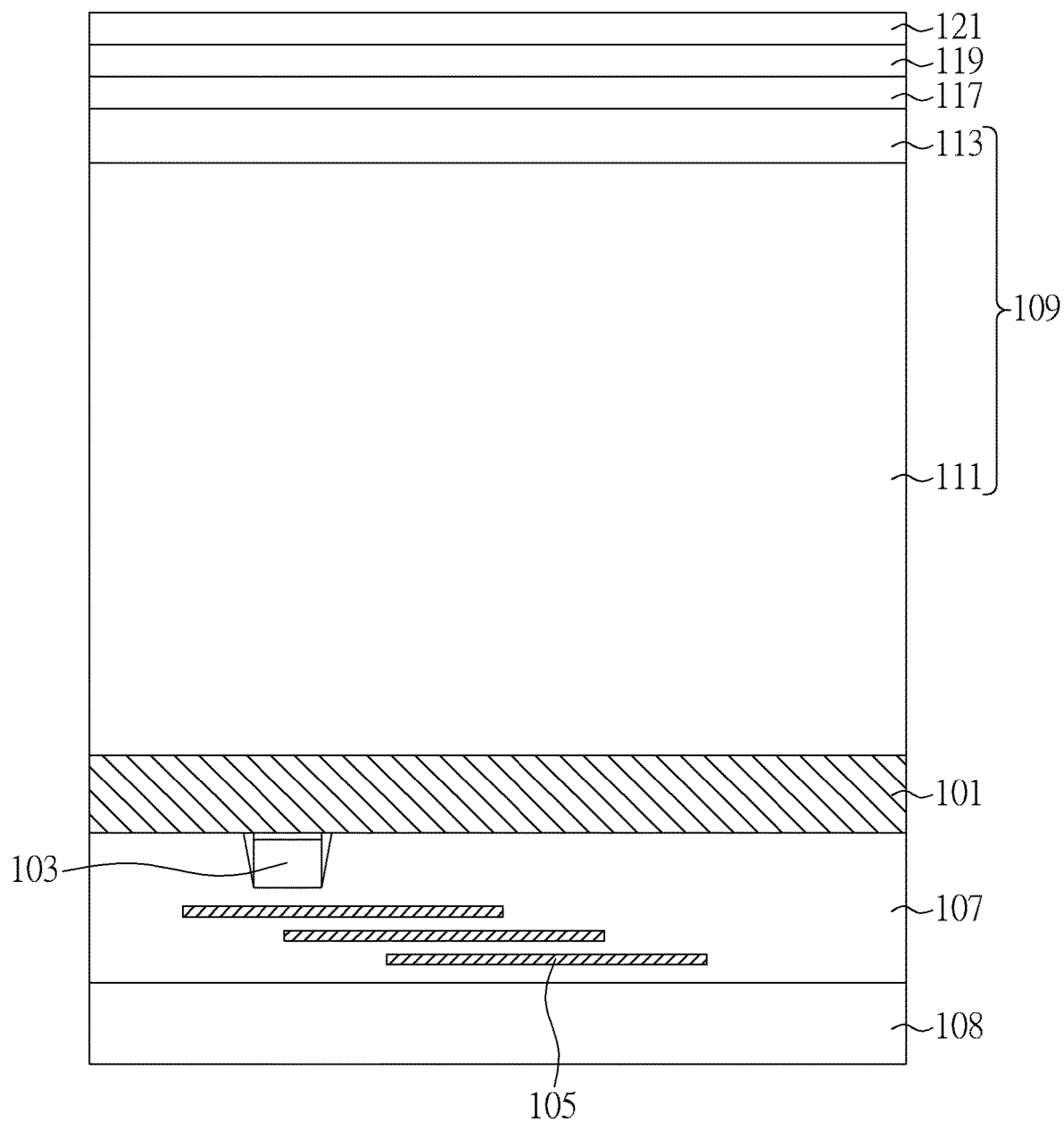
FIGS. 1-6 are schematic cross-sectional views of a process for fabricating a solid-state image sensor in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

The process flow of present invention is now described in following embodiments with reference to the cross-sectional structures shown in FIGS. 1-6. Please note that, although the figures provided in the disclosure show only one pixel unit, it should be understood that the actual solid-state image sensor structure may include multiple pixels arranged in a two-dimensional array with a peripheral circuit section disposed in a periphery thereof. The peripheral circuit section may include various circuits for achieving the operation and the processing of image sensor, for example, like a vertical drive circuit, a column signal processing circuit, a horizontal drive circuit, an output circuit, and a control circuit. The pixel itself may include transistors that are configured corresponding to the circuits above, for example, like a transfer transistor, a selection transistor, a reset transistor, and an amplification transistor. Since the aforementioned components are all conventional and are not the essential features of the present invention, those components will not be described and shown in the specification and drawings.

First, please refer to FIG. 1. The solid-state image sensor provided in the present invention is a back side illuminated (BSI) MOS image sensor structure, wherein light rays will enter the image sensor from a back side of semiconductor substrate opposite to the front side where the image sensor disposed. As shown in FIG. 1, a semiconductor substrate 101 is first provided with its front side (the lower side in the figure) formed in advance with circuit structures like pixel transistors 103 and multiple wiring layers 105. Dielectric layers 107, for example interlayer dielectrics (ILD) and inter-metal dielectrics (IMD), are formed between the wiring layers 105. The pixel transistor 103 is used to read the charges accumulated in photodiodes formed on the back side. After the pixel transistors 103 and the wiring layers 105 are formed, a bonding process is then performed to bond a carrier wafer 108 with the dielectric layer 107. The carrier wafer 108 serves as a substrate for following backside processes to reinforce the structural strength of wafer. The material of carrier wafer 108 may be high-temperature glass or glass-like material, or alternatively, silicon material. After the carrier wafer 108 is bonded, the entire wafer is then flipped to carry on the backside processes.

Refer again to FIG. 1. The material of semiconductor substrate 101 may be silicon, such as a p-type semiconductor substrate. A photoelectric conversion portion (i.e. photodiode) 109 is formed on the semiconductor substrate 101, including a n-type semiconductor layer (e.g. n-type doped semiconductor layer) 111 and a semiconductor material layer 113, wherein the semiconductor material layer 113 may be a n-type/p-type semiconductor layer, an intrinsic semiconductor layer or a combination thereof. In the embodiment, the n-type semiconductor layer 111 would contact the p-type semiconductor substrate 101 that has different doping type, while the semiconductor material layer 113 is located on the n-type semiconductor layer 111 to serve as a light-receiving layer and may accumulate positive charges to suppress dark current. In real implementation, the n-type semiconductor layer 111 may be formed by doping the p-type semiconductor substrate 101 to form a n-type well.

Refer still to FIG. 1. A multilayer structure is further formed on the semiconductor material layer 113, with the feature of gradually decreasing refractive index from the semiconductor material layer 113 to the light-receiving surface and smaller than the refractive index of semiconductor material layer 113 contacting therewith. For example, the multilayer structure may sequentially include a titanium oxide layer 117, a silicon nitride layer 119 and a silicon oxide layer 121 and formed by CVD or PVD processes. Starting from the semiconductor material layer 113 with a refractive index about 3.88 on the basis of a reference wavelength 633 nm, the refractive index of titanium oxide layer 117 is about 2.6, smaller than 3.88. The refractive indexes of overlying silicon nitride layer 119 and silicon oxide layer 121 are about 2 and 1.46, respectively, and the refractive indexes of ambient air is about 1. Through the formation of this particular anti-reflective structure with gradually decreasing refractive index toward the light-receiving surface, the reflectance of light rays in visible light band may be significantly reduced to efficiently improve the incident light density of the image sensor.

Figure 2:
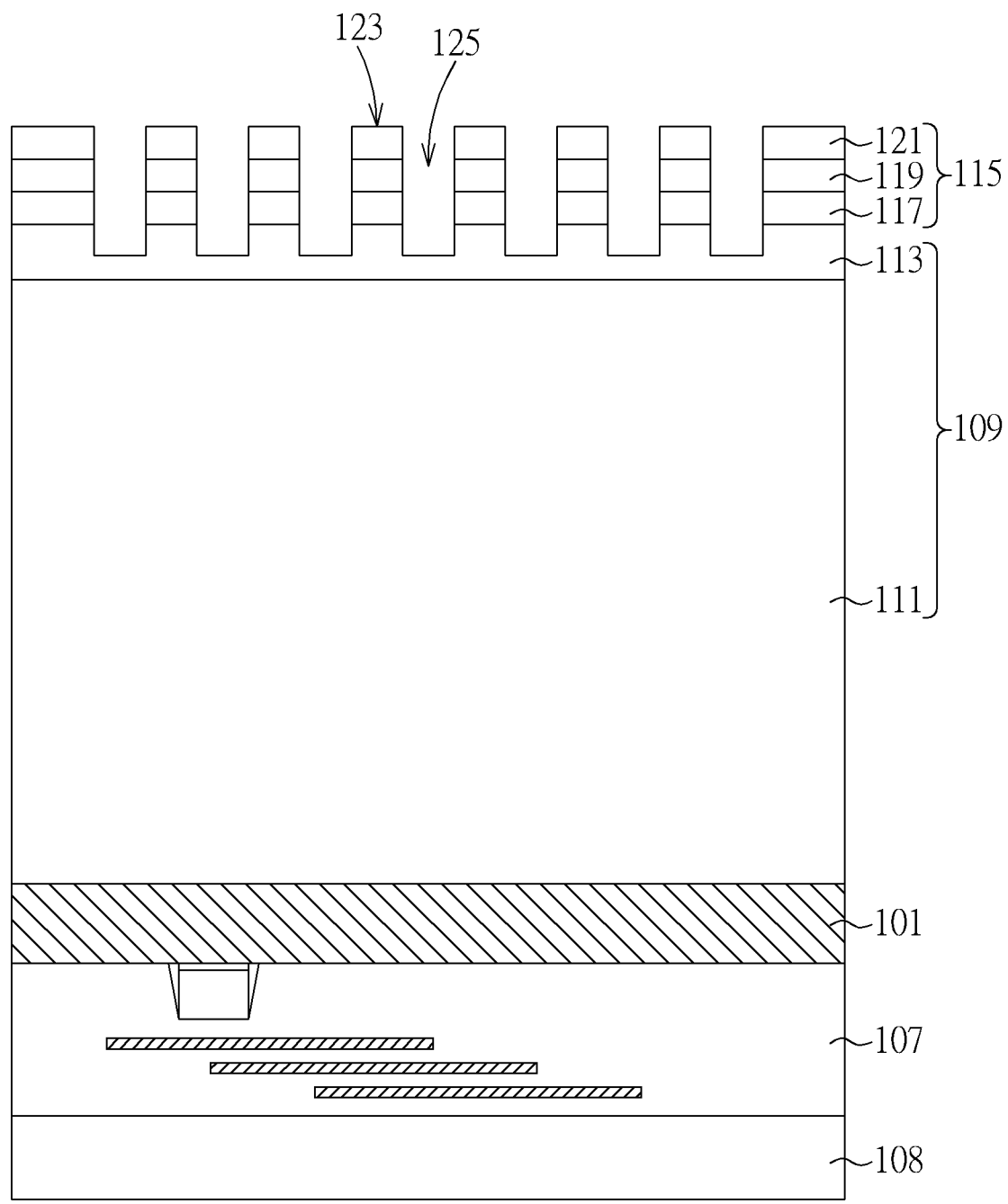

Next, please refer to FIG. 2. After the multilayer structure is formed, a photolithography process is then performed to form multiple micro pillars 123 protruding upwardly from the semiconductor material layer 113 to constitute an anti-reflective portion 115. The micro pillars 123 are uniformly distributed on the surface of entire photoelectric conversion portion 109 and are isolated by recesses 125 extending into the semiconductor material layer 113. More specifically, the photolithography process may include the steps of forming a photoresist (not shown) with patterns of the micro pillars on the surface of the multilayer structure, and a dry etching or wet etching process is then performed with the photoresist as a mask to remove a portion of the multilayer structure and the semiconductor material layer 113 to form the micro pillars 123 as shown in the figure. The etching process is preferably an anisotropic dry etching process, so that the resulting micro pillars 123 may have more upright sidewalls. Please note that the essential feature of the present invention in this embodiment is the micro pillars 123 made of the multilayer structure with gradient refractive index. With this kind of uneven micro pillars 123 on the light-receiving surface, the diffraction degree of incident light may be greatly increased, much like the mechanism of moth-eye structure and black silicon technology. Furthermore, by cooperating with the technological feature of the material with gradient refractive index to form the micro pillars 123, the reflectance of incident light may be reduced and the quantum efficiency of the photodiode may be greatly improved. Relevant detail will be further described in following embodiment.

Figure 3:
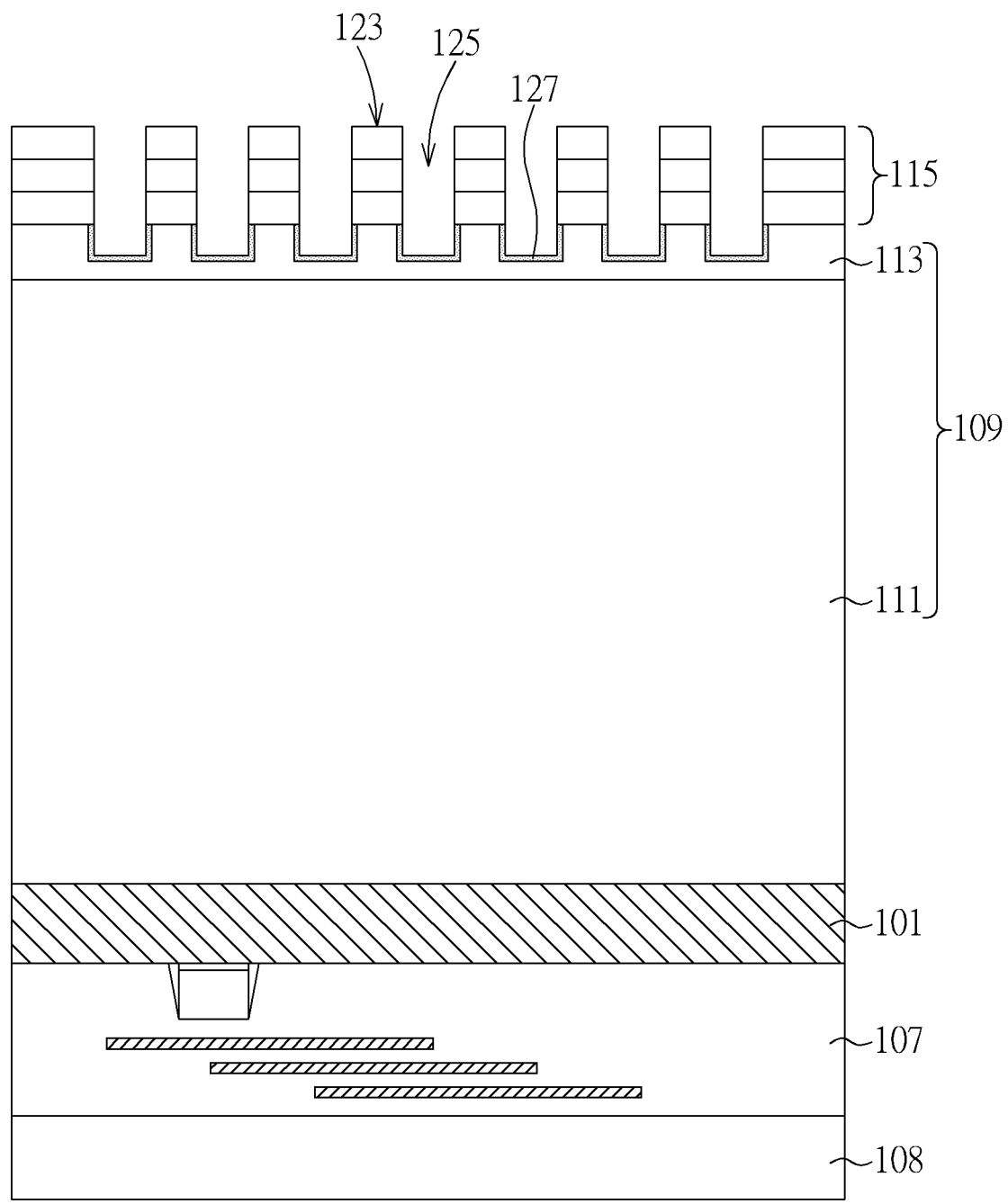

Next, please refer to FIG. 3. In some embodiment, as shown in the figure, a low-temperature (<400° C.) epitaxy process may be performed to form an epitaxial layer 127 on the surface of recesses 125 of the light-receiving layer (i.e. semiconductor material layer 113), for example, a Si or SiGe epitaxial layer with the same doping type as the one of the semiconductor substrate 101, to suppress the dark current generated at the interface. In other embodiment, alternatively, a high-k dielectric layer (ex. $HfO_2$, $ZrO_2$, $Ta_2O_5$) with fixed negative charges may be formed on the surface of micro pillars 123 and recesses 125 to replace the epitaxial layer 127.

Figure 4:
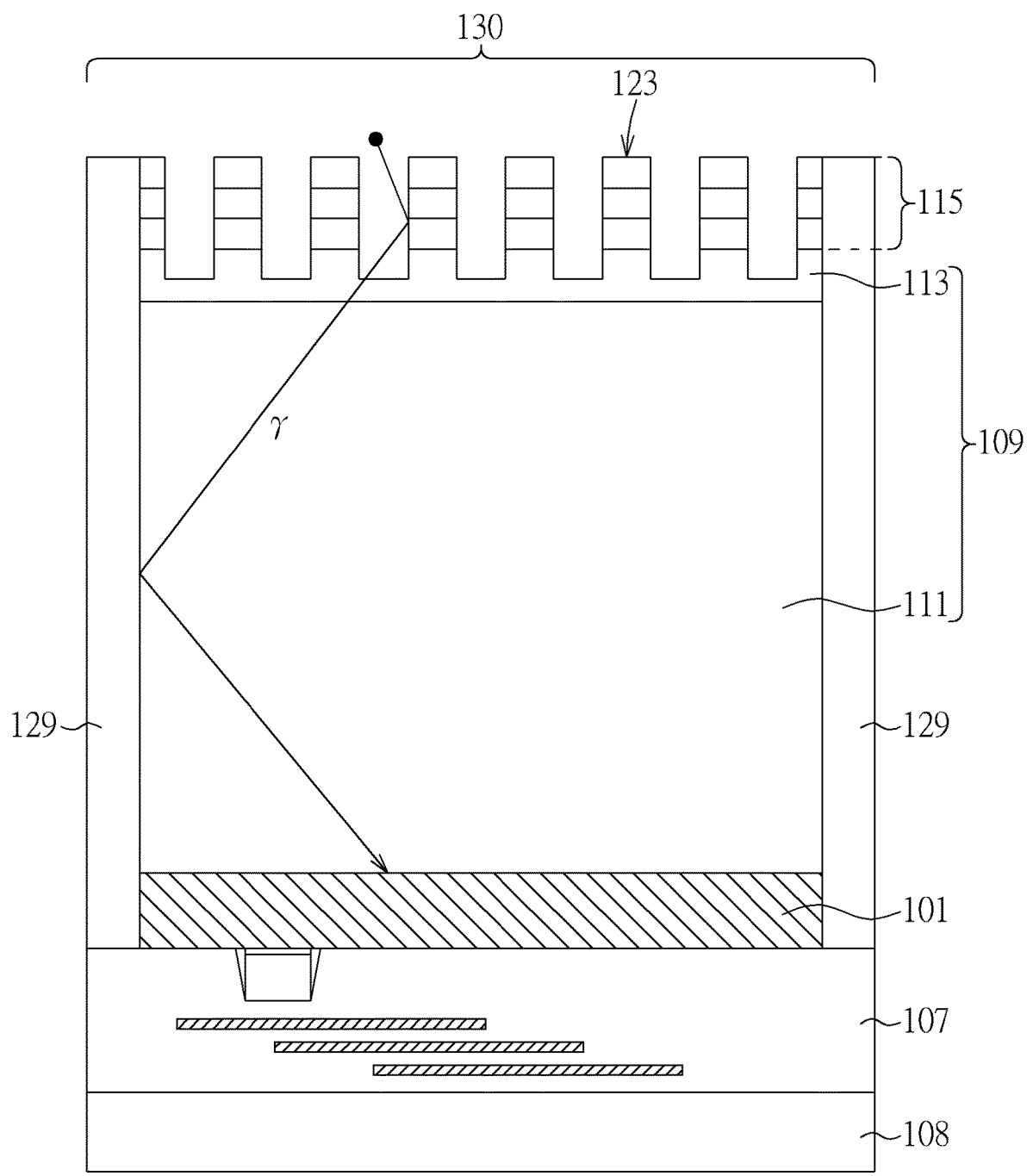

Next, please refer to FIG. 4. After the micro pillars 123 are formed, inter-pixel blocking portions 129 (or referred as deep trench isolation) are then formed between the photoelectric conversion portion 109. The inter-pixel blocking portions 129 may define every pixel unit 130 in the image sensor and are formed around the pixel units 130 to serve as a blocking wall structure between the pixel units 130, thereby preventing incident photons and electrons in the pixel from entering adjacent pixels and causing color mixture or noise issues. Furthermore, by cooperating with the aforementioned diffraction feature granted by micro pillars 123, the light path of long-wavelength near infrared photon within the pixel may be increased to greatly improve the quantum efficiency of photodiode.

In the embodiment of present invention, the inter-pixel blocking portion 129 would extend downwardly from the light-receiving surface to the interface between the semiconductor substrate 101 and the dielectric layer 107. The process of fabricating inter-pixel blocking portion 129 may include the following steps: performing a photolithography process to form deep trenches in the anti-reflective portion 115 and the photoelectric conversion portion 109, and performing a planarization process to remove the blocking material remaining on the surface so that the inter-pixel blocking portions 129 are formed in the deep trenches. The aforementioned photolithography process is preferably an anisotropic dry etching process to ensure the resulting deep trench having an upright sidewall. Furthermore, in order to bring about total internal reflection when photons collides the inter-pixel blocking portions 129, the refractive index of the blocking material should be much smaller than the refractive index of the photoelectric conversion portion 109. For example, by using silicon oxide with refractive index 1.46 much smaller than the refractive index 3.88 of photoelectric conversion portion 109 to form the inter-pixel blocking portions 129, it may ensure that most of light is totally reflected at the interface and doesn't leak into adjacent pixels. Other available blocking material may further include the dielectrics such as SiN, SiON, $HfO_2$, $Al_2O_3$, $ZrO_2$, $Ta_2O_5$, $TiO_2$ and $La_2O_3$. In some embodiments, the inter-pixel blocking portions 129 may be formed by surrounding metal material or doped silicon with aforementioned blocking materials.

Please note that in other embodiment, the inter-pixel blocking portions 129 may be formed before the formation of micro pillars 123.

Figure 5:
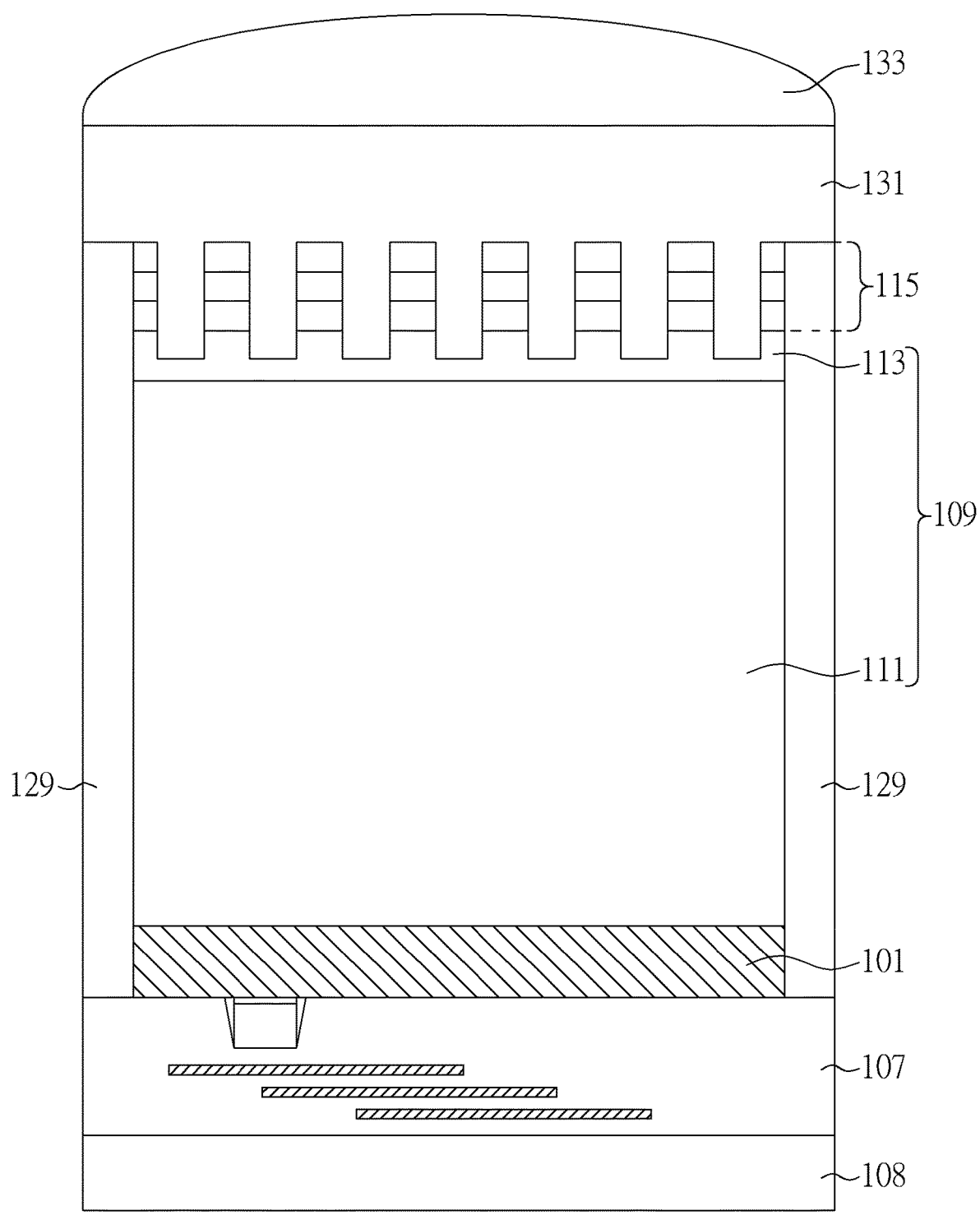

Next, please refer to FIG. 5. After the inter-pixel blocking portions 129 are formed, the structures like color filter 131 and micro lens 133 are then formed sequentially on the pixel units. Before forming the color filter 131, a transparent organic planarization layer (not shown) may be formed in advance on the surface by coating method, then the color filter 131 is formed. The transparent organic planarization layer may be made of resin and with a refractive index preferably smaller than the overall refractive index of anti-reflective portion 115. Regarding to individual pixels, the color of color filter 131 may be different, for example, with different colors like red, green or blue. The color filter 131 may be formed by, for example, spin-coating using photosensitive resin containing a coloring matter such as pigment or dye. Metal-based black matrix (not shown) may be further provided between pixels in the color filter 131. Each micro lens 133 would correspond to a pixel unit and may be made of resin-based material such as styrene, acrylic or siloxane.

The incident light may be focused on corresponding pixel by micro lens 133 and enters photoelectric conversion portion 109. The refractive index of micro lens 133 and color filter 131 is about 1.5-1.9, which is close to the refractive index of the contacting surface of organic planarization layer or the anti-reflective portion 115. Therefore, they will not affect the incident of light rays.

Figure 6:
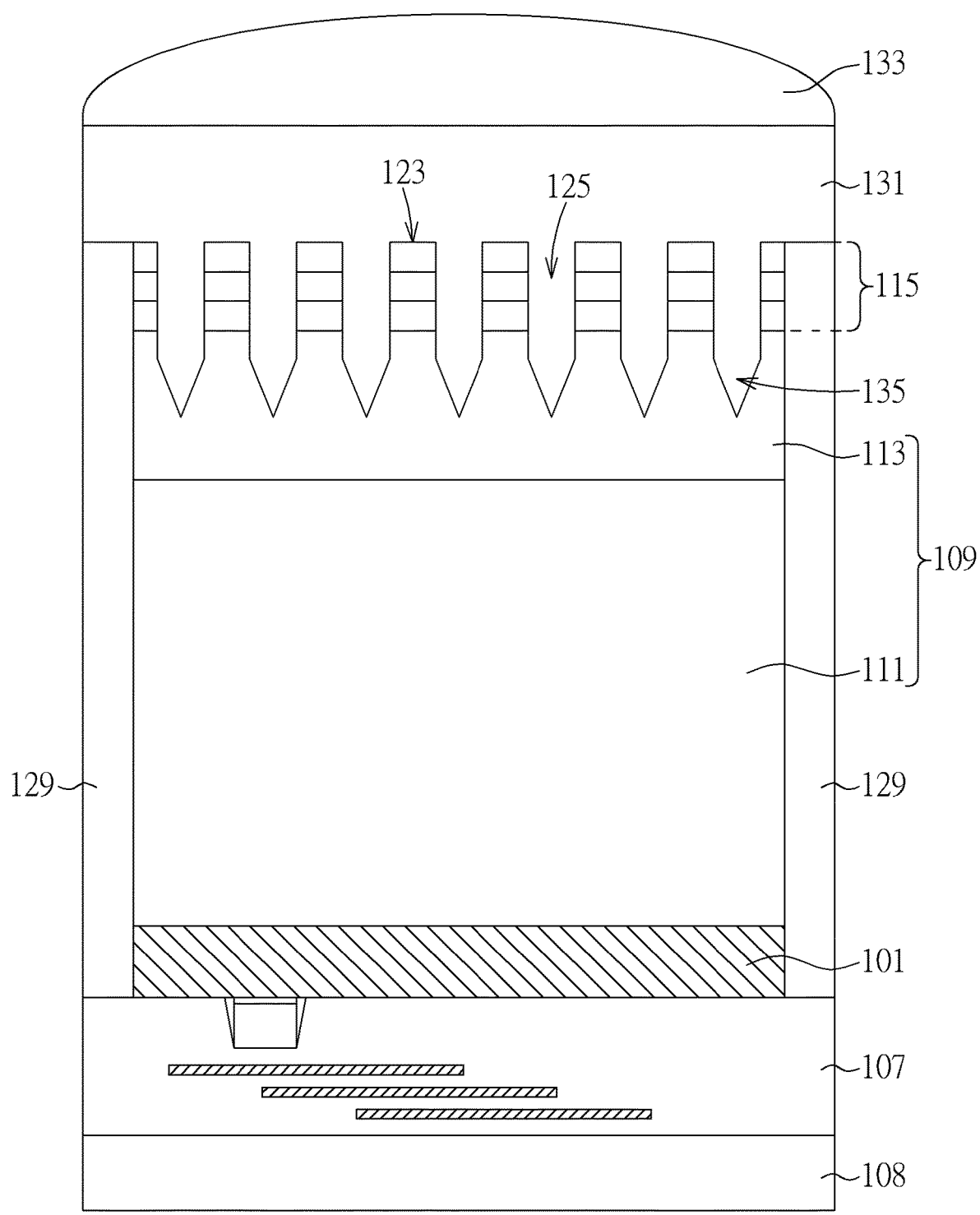

Next, please refer to FIG. 6. In addition to the aforementioned anti-reflective portion 115 and micro pillars 123 with gradient refractive index, the present invention further provides other features that may be used to improve the performance of image sensor. As shown in FIG. 6, the recesses 125 between micro pillars 123 may be formed into cone-shaped bottoms 135 to further increase the diffraction degree of overall light-receiving surface, thereby further improving the quantum efficiency of photodiode. The range of cone-shaped bottom 135 is not limited at the semiconductor material layer 113 of the photoelectric conversion portion 109, instead, it may also extend to the underlying n-type semiconductor layer 111, and its surface may be formed with an epitaxial layer 127 as shown in FIG. 3 or a high-k dielectric layer with fixed negative charges. In the aspect of process, the cone-shaped bottom 135 may be formed by tuning the corresponding etching recipes and parameters to make only the silicon-based bottom end of the recess 125 tapered gradually. In this way, the micro pillars 123 and the recesses 125 may be formed in the same photolithography process.

Figure 7:
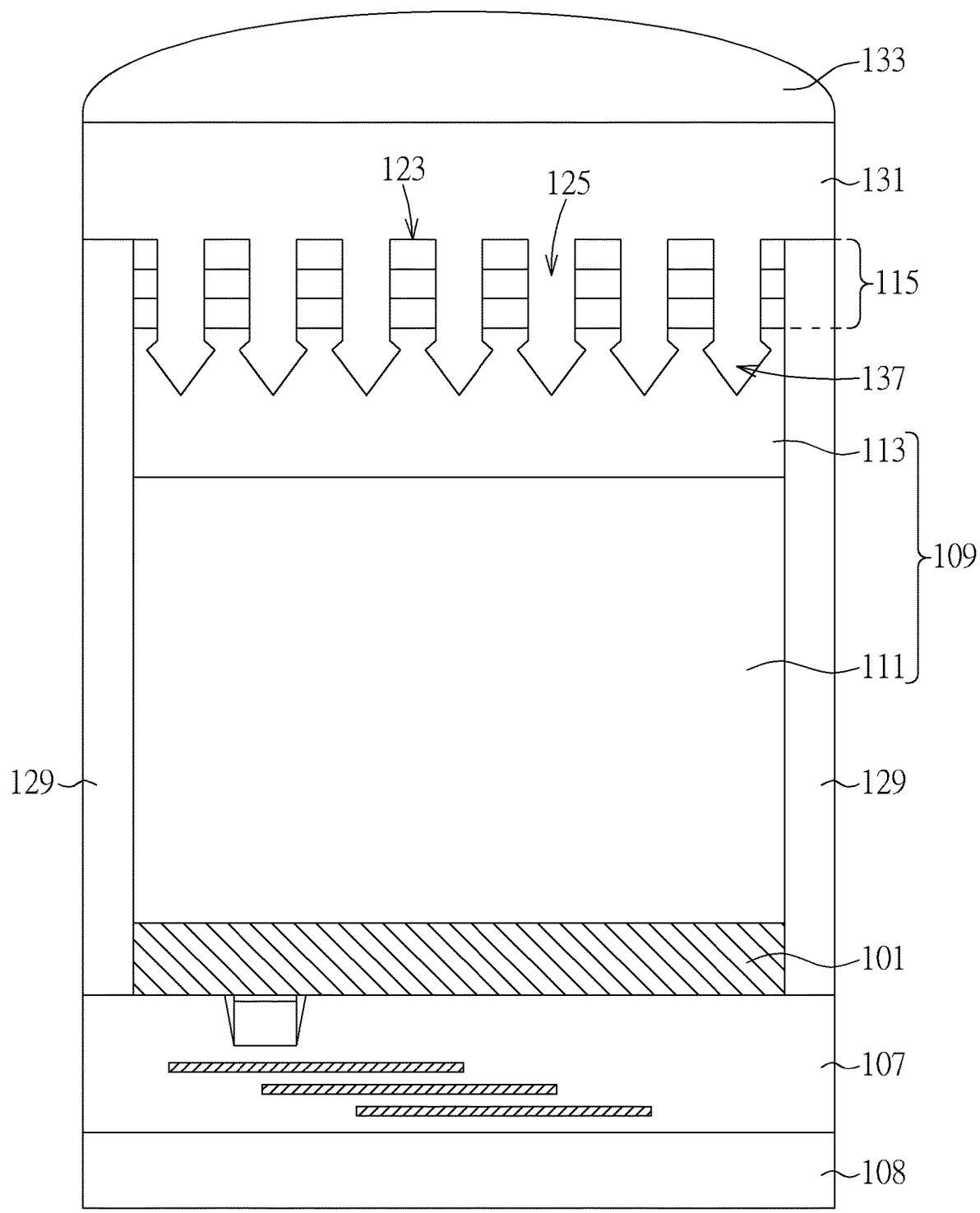
FIG. 7 is a schematic cross-sectional view of a solid-state image sensor in accordance with another embodiment of the present invention.

In other embodiment, the recessed diffraction structure of the present invention may have other variants. As shown in FIG. 7, the cone-shaped bottom 135 of recess 125 may be modified into a diamond-shaped bottom 137 with {111} crystallographic planes. The diamond-shaped bottom 137 with more crystallographic planes may further increase the diffraction degree of incident light. In the aspect of process, the diamond-shaped bottoms 137 may be formed by directly performing a wet etching process to the recesses 125 without using additional reticles. More specifically, when the material of semiconductor material layer 113 is Si {100} substrate, TMAH-based anisotropic etchant may be used to etch the semiconductor material layer 113. Since TMAH solution has far larger etching rate to Si {100} crystallographic plane than to Si {111} crystallographic plane, the etching rate would be decreased gradually to form the recesses with diamond-shaped bottom feature as shown in the figure. In addition, since the overlying micro pillars 123 are dielectrics with far smaller etching rate in the TMAH solution, the micro pillars 123 will not be affected by the wet etching process.

Figure 8:
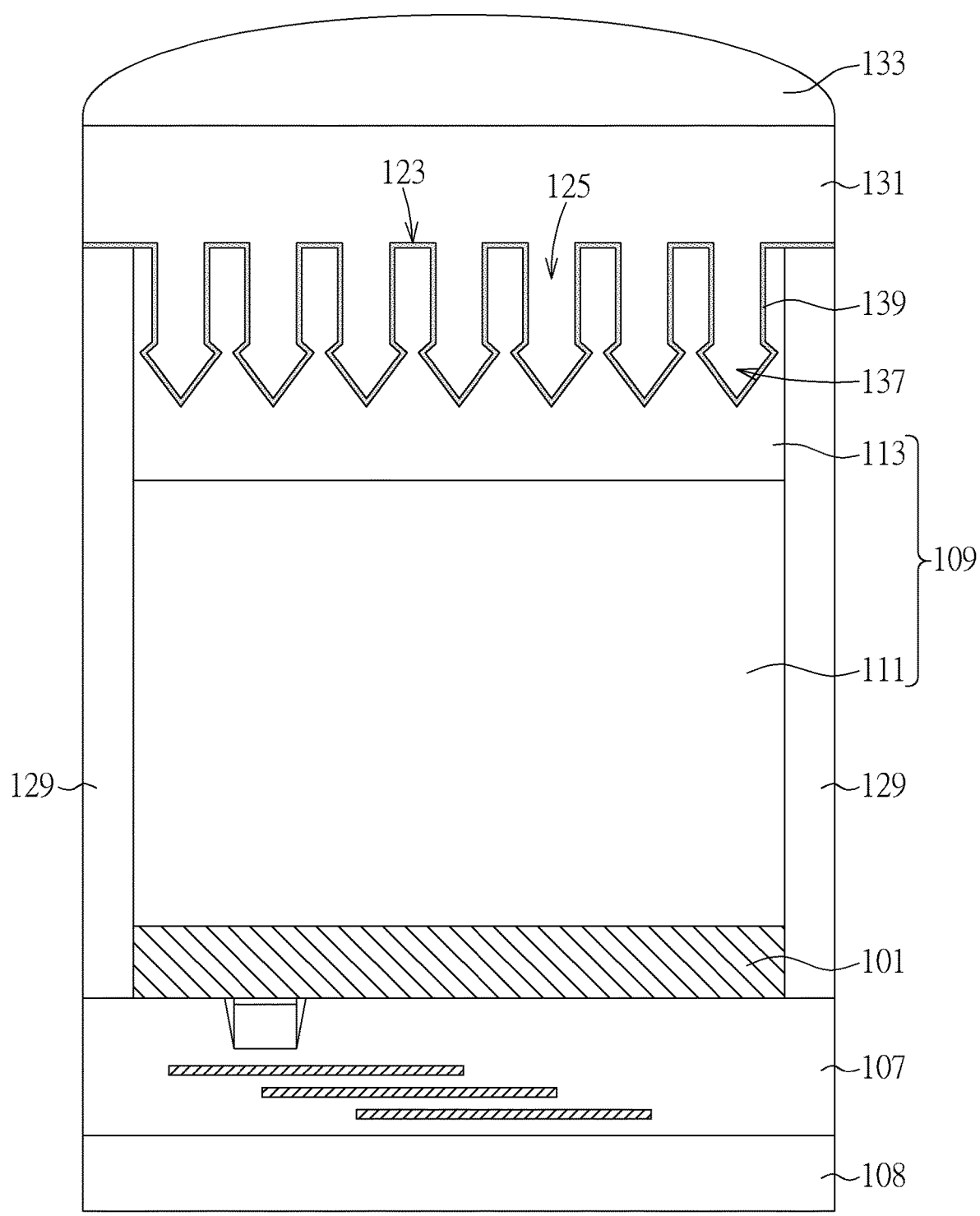
FIG. 8 is a schematic cross-sectional view of a solid-state image sensor in accordance with still another embodiment of the present invention.

Please note that in some embodiment, as shown in FIG. 8, the multilayer structure in aforementioned embodiments may not be formed. Instead, the micro pillars 123 and the recesses 125 with Si {111} diamond-shaped bottoms 137 may be directly formed in the semiconductor material layer 113 and may extend to the underlying n-type semiconductor layer 111, and an epitaxial layer with the same doping type as the one of the semiconductor substrate 101 or a high-k dielectric layer with negative charges (not shown) may be formed on the surface of micro pillars 123 and recesses 125. Furthermore, an anti-reflective film 139 may be formed on entire surface of micro pillars 123 and recesses 125. The refractive index of anti-reflective film 139 is smaller than the refractive index of photoelectric conversion portion 109. It may also be made in the form of multiple material films to achieve the effect of gradient refractive index like the one in anti-reflective portion 115. For example, the anti-reflective film 139 may be formed using materials such as SiN, SiON, $HfO_2$, $Al_2O_3$, $ZrO_2$, $Ta_2O_5$, $TiO_2$ and $La_2O_3$.

According to the solid-image sensor and method of fabricating the same in the aforementioned embodiments of the present invention, the use of micro pillars made of materials with gradient refractive index may greatly reduce the reflectance of incident light, thereby increasing the light density in the photoelectric conversion portion. Moreover, by cooperating with the micro pillars and the recess feature isolated therebetween with particular bottom shape, the diffraction degree of light may be significant improved to increase the light path of photon in the photoelectric conversion portion, thereby greatly improving the quantum efficiency of the image sensor. It is an invention provided with both distinguishing and efficient features.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A solid-state image sensor, comprising:
a first type doped semiconductor substrate;
multiple pixels on said first type doped semiconductor substrate, wherein each of said pixels comprises a photoelectric conversion portion made of a second type doped semiconductor layer and a semiconductor material layer, and said second type doped semiconductor layer contacts said first type doped semiconductor substrate;
an anti-reflective portion with multiple micro pillars on said semiconductor material layer, wherein said micro pillars are isolated by recesses extending into said photoelectric conversion portion, and a refractive index of said micro pillar gradually decreases from bottom to top and is smaller than a refractive index of said semiconductor material layer;
a first type doped epitaxial layer on said photoelectric conversion portion exposed from said recesses;
a microlens on said anti-reflective portion; and
multiple inter-pixel blocking portions between said pixels.

2. The solid-state image sensor according to claim 1, further comprising a high-k dielectric layer with negative charges on said micro pillars and said recesses.

3. The solid-state image sensor according to claim 1, wherein said recess is provided with a tapered bottom.

4. The solid-state image sensor according to claim 1, wherein said recess is provided with a diamond-shaped bottom with {111} crystallographic planes.

5. The solid-state image sensor according to claim 1, wherein said micro pillar comprises a titanium oxide layer, a silicon nitride layer and a silicon oxide layer sequentially from said semiconductor material layer.

6. The solid-state image sensor according to claim 1, wherein said first type doped semiconductor substrate is a p-type semiconductor substrate, and said second type doped semiconductor layer is a n-type semiconductor layer.

7. The solid-state image sensor according to claim 1, wherein said first type doped semiconductor substrate is a n-type semiconductor substrate, and said second type doped semiconductor layer is a p-type semiconductor layer.

8. The solid-state image sensor according to claim 1, wherein said semiconductor material layer is a first type doped semiconductor layer, a second type doped semiconductor layer, an intrinsic semiconductor layer or a combination thereof.

\* \* \* \* \*